United States Patent [19]

Brodine

[11] Patent Number: 5,899,653
[45] Date of Patent: May 4, 1999

[54] TWO-STAGE VACUUM BELLOWS

[75] Inventor: Jeff Brodine, Los Gatos, Calif.

[73] Assignee: Applied Materials, Inc., Santa Clara, Calif.

[21] Appl. No.: 08/880,328

[22] Filed: Jun. 23, 1997

[51] Int. Cl.$^6$ .................................................. B65G 49/07
[52] U.S. Cl. ........................................ 414/222; 414/939
[58] Field of Search .............................. 414/744.3, 222, 414/935, 936, 939; 901/17; 294/1.1; 118/500, 728, 729, 733

[56] References Cited

U.S. PATENT DOCUMENTS

| | | | |
|---|---|---|---|
| 5,234,303 | 8/1993 | Koyano | 414/939 |
| 5,266,119 | 11/1993 | Taniguchi et al. | 118/733 |
| 5,443,648 | 8/1995 | Ohkase | 118/728 |
| 5,445,491 | 8/1995 | Nakagawa et al. | 414/939 |
| 5,516,367 | 5/1996 | Lei et al. | |
| 5,569,350 | 10/1996 | Osada et al. | 118/729 |
| 5,695,568 | 12/1997 | Sinha et al. | 118/729 |

*Primary Examiner*—Dean Kramer
*Attorney, Agent, or Firm*—Patterson & Associates

[57] ABSTRACT

An apparatus for lifting an object in a sealed chamber and transferring an object from a robot to an operating member has a pair of concentrically mounted support members. A lower support member positioned within the chamber extends through an opening in the chamber is adapted to lift a wafer from a robot. A motion actuator positioned outside the chamber and attached to the lower support member is adapted to move the lower support member axially. An upper support member positioned within the chamber above the lower support member extends through an axial passageway in the lower support member to a position external the chamber and below the lower support member. A separate motion actuator positioned outside the chamber and attached to the upper support member is adapted to move the upper support member axially. A flexible vacuum bellows positioned in the chamber and between the upper support member, the lower support member, and the chamber provides a seal therebetween.

20 Claims, 2 Drawing Sheets

TWO-STAGE VACUUM BELLOWS

BACKGROUND OF THE INVENTION

1. Field of the Invention

The present invention relates generally to the processing of substrates to form integrated circuit wafers and equipment useful for such processing. More particularly, the invention relates to processes and equipment for moving a lifting member within a sealed vacuum chamber.

2. Background of the Related Art

In the fabrication of integrated circuits, the processes are often carried out in a vacuum environment to, among other things, reduce the particulate level to which the wafers are exposed. Robots within the vacuum processing systems move the wafers horizontally through the system and position the wafers in a series of processing stations in which a series of processing steps are carried out.

Within each of the processing stations, or chambers, the wafer is transferred from the robot onto a pedestal. To complete the transfer, the robot, which supports the wafer from the bottom, positions the wafer over the pedestal. A receiver apparatus, typically in the form of a plurality of vertically extending fingers connected at their lower ends on a lifting hoop (although other embodiments are known), moves upward through slots in the pedestal to lift the wafer from the robot. The receiver apparatus has a shaft extending out of the bottom of the chamber where it is connected to a positioning device. With the wafer supported by the receiver apparatus, the robot retracts from the chamber. The processing pedestal then moves upward beyond the receiving apparatus lifting the wafer from the receiver apparatus and into an upper position where the process step is performed. Like the receiving apparatus, the processing pedestal has a shaft extending through the bottom of the chamber where it is driven by a separate positioning device.

In prior art devices, the pedestal shaft is generally concentric with the platform. The lifting hoop of the receiving apparatus is also generally concentric with the platform so that the fingers are equally spaced about the platform to provide sufficient and balanced support for the wafer. However, in the prior art devices, the shaft of the receiving apparatus is offset from the axis of the lifting hoop and is parallel to the processing platform shaft. An extension arm connects the lifting hoop to the receiving apparatus shaft.

Accordingly, the prior art devices have two parallel shafts extending through the bottom of the chamber and require two openings in the bottom of the chamber. Each of these openings must be sealed in order to maintain the required vacuum within the chamber. To seal the chamber around the openings, a collapsible bellows extends between the platform and the chamber bottom and a separate collapsible bellows extends between the upper end of the receiving apparatus shaft and the chamber bottom. The collapsible bellows is required due to the relative movement of the shafts in the chamber. However, each of the vacuum to atmosphere interfaces, the bellows seals, are a source for leaks which result in system inefficiency and downtime.

Also, the prior art designs necessitate the use of a relatively larger chamber because of the offset receiver shaft. This larger chamber takes additional space, a precious commodity in manufacturing clean rooms, and requires additional material to manufacture and additional energy to maintain the required vacuum within the chamber. Having the offset shaft also restricts the use of a circular chamber and increases inefficiency and manufacturing costs.

SUMMARY OF THE INVENTION

In view of the foregoing, it is an object of the invention to provide an apparatus for supporting and moving a wafer within a sealed vacuum chamber. It is another object of the invention to eliminate the dual parallel shaft arrangement of prior art devices as well as the associated second offset opening and bellows and use a single opening and bellows. Yet another object of the invention is to provide a smaller chamber that lends itself to a concentric construction. Still a further object of the invention is to provide a more efficient system that has less down time. Other objects of the invention will become apparent from time to time throughout the specification and claims as hereinafter related.

In accordance with the invention, an apparatus is provided to replace the offset shaft design of the prior art systems with a concentric two-stage apparatus for lifting an object within a sealed chamber. Using a concentric design permits the use of a single bellows seal and a single opening in the chamber.

In a preferred embodiment, the apparatus has a moveable lower support member disposed within the chamber. The lower support member has an end portion that extends from the chamber and an axial passageway that extends through the lower support member. Interconnected to the end portion of the lower support member is a first motion actuator that is adapted to move the lower support member axially. A moveable upper support member is also disposed within the chamber and has an end portion that extends through the axial passageway of the lower support member and from the chamber. The upper support member is longer than the lower support member and extends from a position above the lower support member through the axial passageway to a position below the lower support member. A second motion actuator interconnected to the end portion of the upper support member is adapted to move the upper support member axially. One or more flexible sealing members provides a seal between the upper support member, the lower support member, and the chamber.

In one embodiment of the invention, the sealing member is a flexible bellows that extends between an upper connecting member of the upper support member and a lower connecting member of the lower support member and between the lower connecting member and the chamber wall.

The upper connecting member may be a generic plate having attachment features for attaching an upper operating member to the upper support member, thus, allowing connection of a variety of upper operating members to the upper support member. Alternatively, a platform, heater, or other typical semiconductor processing platform may serve as the upper connecting member. Likewise, the lower connecting member may be a generic plate having attachment means for attaching a lower operating member or it may be a typical receiving member or lifting hoop.

Additionally, the upper support member may include an axial passageway to facilitate routing of power and communication lines to the operating devices attached to the upper terminus of the upper support member.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
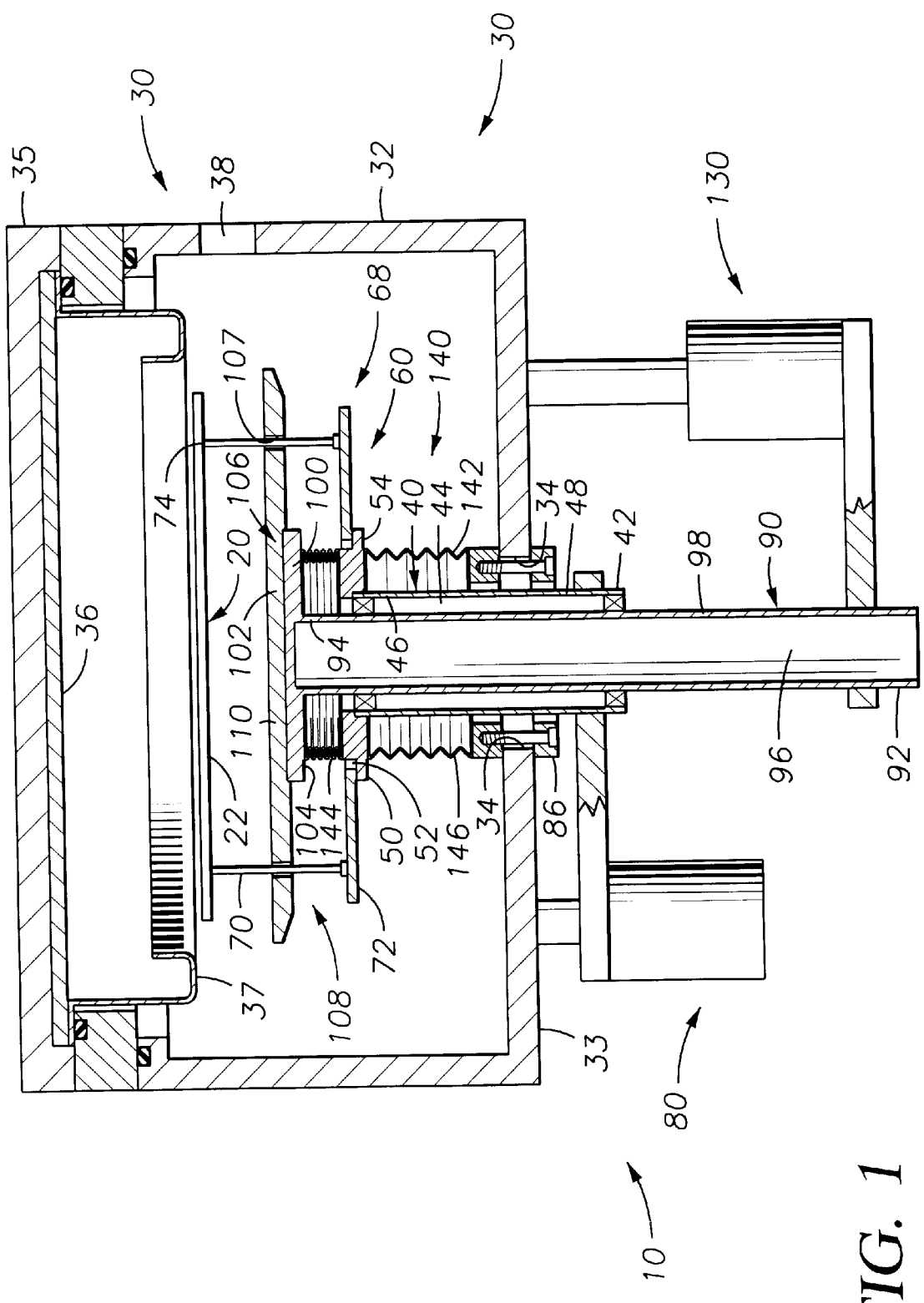
FIG. 1 is a side cross sectional view of the lifting apparatus having a pedestal mounted thereon.

Referring to FIG. 1, two-stage lifting apparatus 10 for lifting an object in a chamber 30 is shown coupled to a chamber 30. The apparatus 10 generally comprises a pair of concentric moveable support members, 40 and 90, partially disposed within the chamber 30 and adapted for vertical movement by a pair of corresponding motion actuators, 80 and 130. One or more flexible sealing members 140 provides a seal between the upper support member 90, the lower support member 40, and the chamber 30. The flexible sealing member 140 may be either a single member or a multi-piece member such as a two piece member.

The chamber 30 includes an outer generally cylindrical wall 32 interconnected to a lower generally circular base 33 and a cover 35, disposed at the top of the chamber 30, opposite the base 33. The base 33, cover 35, and wall 32 are also collectively referred to herein as the wall 32. The chamber 30 includes a target 36 suspended from the cover 35 and a spun deposition shield 37 projecting downward from the cover 35 into the chamber 30. The spun deposition shield 37 is aligned with the target 36 and the upper support member 90. A slit valve opening 38 in the wall 32 permits the introduction of an object 20 such as a wafer 22 into the chamber 30 by a robot 200. Additionally, the present invention has application with other processing chambers and processes such as chemical vapor deposition processes and others which require movement of a support member within an enclosure.

The robot 200 (shown in FIG. 2) supporting the wafer 22 on a robot arm 202 positions the wafer 22 through the slit valve opening 38 into the chamber 30 over the upper support member 90. In order to then lift the wafer 22 from the robot 200 and position it proximal the target 36 for processing, the wafer 22 must be transferred from the robot 200 to the upper connecting member of the upper support member 90. This transfer is accomplished by the two-stage lifting apparatus 10.

The lifting apparatus 10 includes a moveable lower support member 40 disposed within the chamber 30 and having an end portion 42 that extends from the chamber 30 through an opening 34 in the wall 32, particularly the base 33. The lower support member 40 is positioned to receive the wafer 22 from the robot 200 and support the wafer 22 while the robot 200 retracts and until the wafer 22 is transferred to the upper support member 90. The lower support member 40 defines an axial passageway 44 extending therethrough and has an annular cross sectional shape throughout its length. Attached to the upper end 46 of the lower support member 40 is an enlarged lower connecting member 50 having an outer diameter that is greater than the diameter of the remainder of the lower support member 40.

The lower connecting member 50 has an upper surface 52 and lower surface 54 and is preferably relatively flat and forms a plate at the upper end 46 of the lower support member 40. In the preferred embodiment, the lower connecting member 50 includes one or more fasteners 60 for attaching a lower operating member 68 to the lower support member 40. By including the fasteners 60, the lower connecting member 50 is standardized. In this way, the lower connecting member 50 may receive a variety of types of lower operating members 68, thereby allowing the use of the same design of lower support member 40 throughout the system regardless of the exact type of lower operating member 68 required. Typically, the lower operating members 68 are receiving members 70, or lifting hoops. Alternatively, the lower connecting member 50 itself may comprise a receiving member 70 and, thus, the receiving member 70 is an integral component of the lower support member 40.

The purpose of the receiving member 70 is to lift the wafer 22 from the robot 200 and support the wafer 22 while the robot 200 retracts and until the upper support member 90 lifts the wafer 22 to its processing position. A number of possible receiving member designs are possible. One preferred embodiment of the receiving member 70, shown in the figures, comprises a circular support hoop 72 that is coaxial with the lower support member 40. A plurality, preferably three or four, of elongated lifting fingers 74 are equally spaced about the perimeter of the support hoop 72 and extend upwardly therefrom. The lifting fingers 74 have an equal length so that their upper ends lie in a horizontal plane. In this way, a wafer 22 may be positioned and supported on the upper ends of the lifting fingers 74. The diameter of the support hoop 72 is sufficiently large that the lifting fingers 74 are adequately spaced to provide a stable support for a wafer 22 resting on their upper ends.

The remainder of the lower support member 40, the outer shaft 48, extends vertically downward from the lower connecting member 50 through the opening 34. In the preferred embodiment, one or more bearings 86 between the lower support member 40 and the chamber wall 32 at the opening 34 provides support for the lower support member 40 and facilitates its axial movement relative to the chamber 30. An alternate design is to use a bushing or sleeve in the place of the bearings 86 to provide a sliding interface and support between the lower support member 40 and the opening 34. Positioned externally from the chamber 30, a first motion actuator 80 is connected to the end portion 42 of the lower support member 40. The first motion actuator 80 is adapted to move the lower support member 40 axially within the chamber 30.

Typically, the motion actuators, 80 and 130, are connected to the bottom of the chamber 30 and each includes a drive assembly, read assemblies for determining the state of the apparatus, and an interactive controller connected to the read assemblies and to the drive assemblies. Preferably, the motion actuators, 80 and 130, include motors although other motion actuator configurations are possible without departing from the scope of the invention. Also, the manner of translating the rotary motion of the motor into axial motion of the interconnected support, 40 or 90, may take any number of possible known forms including the use of mechanical translational devices such as worm gears or hydraulic translational devices. Any of the known embodiments for producing linear motion may be used in the present invention. An example of one such embodiment of a motion actuator using a worm gear translational device is disclosed in U.S. Pat. No. 5,540,821 that issued to Tepman on Jul. 30, 1996.

To lift the wafer 22 from the lower support member 40 to a raised position for processing, the moveable upper support member 90 is disposed within the chamber 30 and is interconnected to a second motion actuator 130 adapted to move the upper support member 90 axially. The upper support member 90 has an end portion 92 extending from the chamber 30 and a circular outer cross sectional shape throughout its length. It is disposed within the axial passageway 44 of the lower support member 40 and is substantially coaxial and concentric therewith. Attached to the upper end 94 of the upper support member 90 is an upper connecting member 100 that has an outer diameter that is preferably greater than the outer diameter of the remainder of the upper support member 90, the inner shaft 98. The upper end 94 and upper connecting member 100 of the upper support member 90 are positioned above the lower connecting member 50 and upper end 46 of the lower support member 40. Typically, the outer diameter of the enlarged upper connecting member 100 is greater than the diameter of the axial passageway 44 through the lower support member 40. The outer diameter of the inner shaft 98 is less than the diameter of the axial passageway 44 through the lower support member 40. To provide the necessary support for the upper support member 90, the outer diameter of the inner shaft 98 is preferably a relatively tight fit within the axial passageway 44 of the lower support member 40. Bearings or bushings may be provided between the inner shaft 98 and the axial passageway 44 to facilitate the relative movement of the upper and lower support members 40 and 90.

Figure 2:
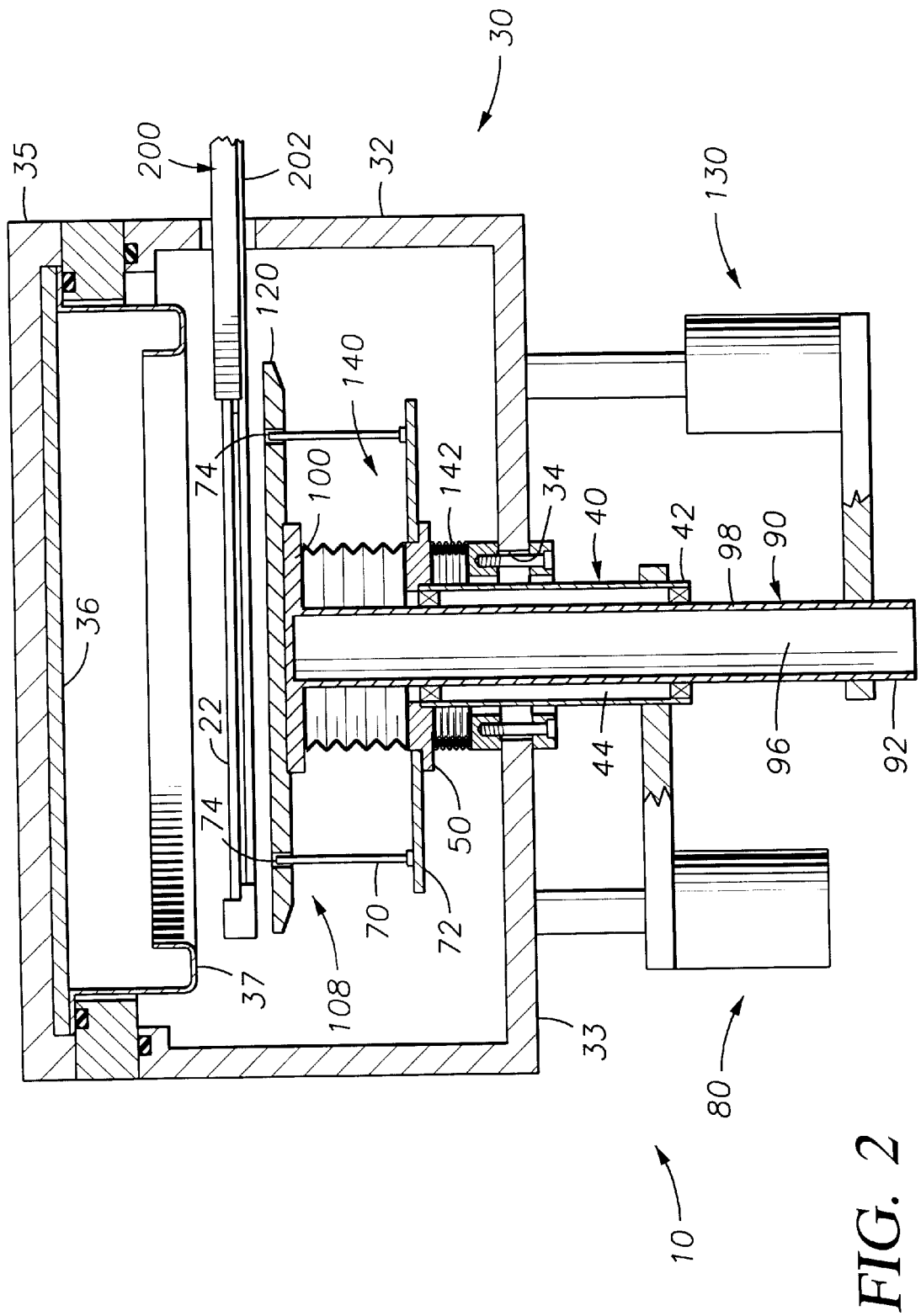
FIG. 2 is a side cross sectional view of the lifting apparatus having a heater plate mounted thereon.

The upper connecting member 100 has an upper surface 102 and lower surface 104 and is preferably relatively flat and forms a plate at the upper end 94 of the upper support member 100. Similar to the lower connecting member 50, the upper connecting member 100 may include one or more fasteners 106 for attaching an upper operating member 108 to the upper support member 90. The use of fasteners 106 facilitates standardization of the upper connecting member 100 thereby enabling the upper connecting member 100 to receive a variety of types of upper operating members 108 so that the same design of upper support member 90 may be used throughout the system regardless of the exact type of upper operating member 108 required. Examples of upper operating members 108 are pedestals 110 (FIG. 1) and heater plates 120 (FIG. 2). Alternatively, the upper connecting member 100 itself may comprise the upper operating member 108, such as a pedestal 110 or heater plate 120, and thus, comprise an integral component of the upper support member 90.

To permit the receiving member 70 of the lower support member 40 to lift the wafer 22, the upper connecting member 100 preferably includes a finger slot 107 extending therethrough for each lifting finger 74 of the receiving member 70. Each lifting finger 74 has a corresponding finger slot 107 extending vertically through the upper connecting member 100 that is positioned and adapted to allow the lifting finger 74 to pass therethrough. Accordingly, the lifting fingers 74 can reach through and above the upper connecting member 100 to support the wafer 22 over the upper support member 90. Any attached upper operating member 108 must also include corresponding finger slots 107 to allow the lifting fingers 74 to reach above the upper operating member 108 and support the wafer 22. Also, it follows that the length of the lifting fingers 74 must be sufficient to extend from the support hoop 72 located below the upper connecting member 100 and any attached upper operating member 108 to a position above these components when the lower support member 40 is in its raised position and the upper support member 90 is in its lowered position.

The upper support member 90 extends through the axial passageway 44 and below the lower support member 40.

The second motion actuator 130 is connected to the end portion 92 of the upper support member 90 at a position below the lower support member 40. The second motion actuator is adapted to move the upper support member 90 up and down within the chamber 30 to complete the transfer and processing of the wafer 22. As previously mentioned, the motion actuators, 80 and 130, may take many forms.

In the preferred embodiment, the upper support member 90 has an axial passageway 96 extending from its bottom end at least partially therethrough. Accordingly, the upper supporting member 90 has an annular cross sectional shape along its length. This axial passageway 96 facilitates the routing of power and communication cables and wires (e.g., cooling lines, instrumentation lines and the like) to the upper end 94 of the upper support member 90.

The vacuum processing system operates in a vacuum. To maintain the vacuum, all of the openings in the system must be sealed from the atmosphere. Accordingly, the opening 34 through which the upper support member 90 and lower support member 40 pass must be sealed to maintain the vacuum in the chamber 30. However, the support members, 40 and 90, move relative to the chamber 30 and are, at times, stationary relative to the chamber 30. Therefore, the seal between the support members, 40 and 90, must be flexible to accommodate the relative movement and must be able to maintain a seal when the components are stationary relative to one another. To accomplish this seal, the lifting apparatus 10 includes one or more flexible sealing members 140 between the upper support member 90, the lower support member 40, and the chamber 30.

In the preferred embodiment, the flexible sealing member 140 is a flexible vacuum bellows 142 that sealably connects the upper support member 90 to the lower support member 40 and the lower support member 40 to the chamber wall 32 at the point where the support members, 40 and 90, penetrate the wall 32. As shown in the figures, the flexible vacuum bellows 142 comprises a flexible upper vacuum wall 144 and an elastically flexible lower vacuum wall 146. The upper vacuum wall 144 forms a flexible seal between the upper connecting member 100 and the lower connecting member 50. The upper end of the upper vacuum wall 144 is sealably connected to the lower surface 104 of the upper connecting member 100 to form a seal at the top of the upper vacuum wall 144. To form a seal at the bottom of the upper vacuum wall 144, the lower end of the upper vacuum wall 144 is sealably connected to the upper surface 52 of the lower connecting member 50.

The outer diameter of the upper vacuum wall 144 is less than the outer diameter of the connecting members, 50 and 100, but greater than the outer diameter of the inner shaft 98 so that the upper vacuum wall 144 attaches to the connecting members, 50 and 100, intermediate their perimeters and the inner shaft 98. The diameters of the connecting members, 50 and 100, must be greater than that of the upper vacuum wall 144 to allow attachment and use of the operating members, 68 and 108. The fasteners, 60 and 106, are positioned outside the vacuum bellows 142 to allow attachment of the operating members, 68 and 108, to the connecting members, 50 and 100.

The fasteners 106 in the upper connecting member 100 may be positioned in the upper surface 102 of the connecting member 100 at a centerline diameter that is smaller than the diameter of the upper vacuum wall 144 provided that the fasteners 106 extend only partially into the upper surface 102. If they were to extend through the upper connecting member 100, the fasteners 106 would form a passageway that would require another seal.

The lower vacuum wall 146 extends and forms a seal between the lower connecting member 50 and the chamber wall 32. The upper end of the lower vacuum wall 146 is sealably connected to the lower surface 54 of the lower connecting member 50; the lower end of the lower vacuum wall 146 is sealably connected to the inner surface of the chamber wall 32. So that the lower vacuum wall 146 attaches to the lower connecting member 50 intermediate its perimeter and the outer shaft 48, the outer diameter of the lower vacuum wall 146 is less than the outer diameter of the lower connecting member 50, but greater than the outer diameter of the outer shaft 48. However, the diameter of the lower vacuum wall 146 is greater than the diameter of the opening 34 so that it can form a seal about the opening 34. The diameter of the lower connecting member 50 must be greater than that of the lower vacuum wall 146 to allow attachment and use of the lower operating member 68. The fasteners 60 are preferably positioned outside the vacuum bellows 142 to allow attachment of the operating member 68 to the lower connecting member 50. Preferably, the upper vacuum wall 144 and the lower vacuum wall 146 have the same diameter. Preferably, the bellows 142 is sealably connected to the support members, 90 and 40, and the chamber 30 by welding.

In operation, the robot 200 positions the wafer 22 through the slit valve opening 38 and into the chamber 30 suspended above the upper and lower support members, 40 and 90. The first motion actuator 80 raises the lower support member 40 from a lowered position upward to a raised position. When forced upward, the receiving member 70 attached to the upper end 46 of the lower support member 40 lifts the wafer 22 from the robot 200 and supports the wafer 22 in the raised position above the robot 200. The robot 200 retracts from the chamber 30. Next, the second motion actuator 130 raises the upper support member 90 from a lowered position to a raised position. As the upper support member 90 travels upward the upper operating member 108, typically a pedestal 110 or heater plate 120, lifts the wafer 22 from the receiving member 70 and supports the wafer 22 on its upper surface. The upper support member 90 continues to lift the wafer 22 to the raised position proximal the target 36 where the processing step is performed. The transfer process is then reversed to return the wafer 22 to the robot 200 for transport to other components of the vacuum processing system. The flexible seal 142 between the upper support member 90, the lower support member 40, and the chamber 30 collapses and extends as the upper and lower support members, 40 and 90, move relative to each other and/or relative to the chamber and maintain the vacuum within the chamber 30 during the transfer and processing of the wafer 22.

While the foregoing is directed to the preferred embodiment of the present invention, other and further embodiments of the invention may be devised without departing from the basic scope thereof, and the scope thereof is determined by the claims which follow.

I claim:

1. An apparatus for lifting an object in a chamber, comprising:
   a moveable lower support member disposed within the chamber and having an end portion extending from the chamber and defining an axial passageway extending through the lower support member;
   a first actuator connected to the end portion of the lower support member;
   a moveable upper support member disposed within the chamber and having an end portion slidably extending through the axial passageway;
   a second actuator connected to the end portion of the upper support member; and
   one or more flexible sealing members having at least one end connected to the upper support member and at least another end connected to the chamber.

2. The apparatus of claim 1, wherein the one or more flexible sealing members are disposed between the upper support member, the lower support member, and the chamber.

3. The apparatus of claim 1, wherein:
   the lower support member having an annular cross sectional shape;
   the upper supporting member having a annular cross sectional shape; and
   the upper support member and the lower support member are substantially concentric.

4. The apparatus of claim 3, wherein the upper support member defines an axial passageway extending at least partially therethrough and has an annular cross sectional shape.

5. An apparatus for lifting an object in a chamber, comprising:
   a moveable lower support member disposed within the chamber and having an end portion extending from the chamber and defining an axial passageway extending through the lower support member;
   a first motion actuator connected to the end portion of the lower support member;
   a moveable upper support member disposed within the chamber and having an end portion extending through the axial passageway and from the chamber;
   a second motion actuator connected to the end portion of the upper support member; and
   one or more flexible sealing members disposed between the upper support member and the chamber, wherein the one or more flexible sealing members comprise a flexible vacuum bellows sealably connecting the upper support member to the lower support member and the lower support member to the chamber at a point where the upper support member and the lower support member extend through the chamber.

6. The apparatus of claim 5, wherein:
   the upper support member having an upper end;
   an enlarged upper connecting member attached to the upper end of the upper support member;
   the lower support member having an upper end;
   an enlarged lower connecting member attached to the upper end of the lower support member; and
   the flexible vacuum bellows sealably connecting the upper connecting member to the lower connecting member and the lower connecting member to the wall of the chamber at the point where the upper support member and the lower support member penetrate the wall.

7. The apparatus of claim 6, wherein:
   the upper connecting member having an upper surface and a lower surface;
   the lower connecting member having an upper surface and a lower surface;
   the flexible vacuum bellows sealably attached to the lower surface of the upper connecting member and to the upper surface of the lower connecting member; and
   the flexible vacuum bellows also sealably attached to the lower surface of the lower connecting member and to the wall of the chamber at the point where the upper support member and the lower support member penetrate the wall.

8. The apparatus of claim 7, wherein the upper connecting member further comprises one or more fasteners for attaching an upper operating member to the upper support member.

9. The apparatus of claim 7, wherein the upper connecting member is a pedestal.

10. The apparatus of claim 7, wherein the upper connecting member is a heater plate.

11. The apparatus of claim 7, wherein the lower connecting member further comprises one or more fasteners for attaching a lower operating member to the lower support member.

12. The apparatus of claim 7, wherein the lower connecting member is a substrate receiving member.

13. An apparatus for lifting an object in a chamber, comprising
- a moveable lower support member disposed within the chamber and having an end portion extending from the chamber and defining an axial passageway extending through the lower support member;
- a first motion actuator connected to the end portion of the lower support member;
- a moveable upper support member disposed within the chamber and having an end portion extending through the axial passageway and from the chamber, wherein the chamber comprises a wall defining an opening through which the upper support member and the lower support member extend;
- a second motion actuator connected to the end portion of the upper support member;
- an enlarged upper connecting member attached to an upper end of the upper support member;
- an enlarged lower connecting member attached to an upper end of the lower support member; and
- one or more flexible sealing members disposed between the upper support member and the chamber; wherein the one or more flexible sealing members comprise:
  - a flexible upper vacuum wall sealably connecting the upper connecting member to the lower connecting member; and
  - a flexible lower vacuum wall sealably connecting the lower connecting member to the wall of the chamber about the opening in the wall.

14. A method of moving one or more objects in a chamber, comprising:
- locating a moveable lower support member within the chamber;
- locating a movable upper support member within the chamber and within an axial passageway that extends through the lower support member;
- locating the upper support member so that the upper support member extends from a position above the lower support member to a position below the support member;
- moving the lower support member using a first actuator connected to the lower support member;
- moving the upper support member using a second actuator connected to the upper support member; and
- sealing the point where the upper support member and the lower support member extend through the chamber with a flexible seal.

15. The method of claim 14, further comprising:
- positioning the upper support member in a lowered position;
- positioning the lower support member in a lowered position;
- positioning the object over the upper support member and the lower support member;
- actuating the first motion actuator to raise the lower support member to a raised position wherein a receiving member attached to the lower support member lifts the object; and
- actuating the second motion actuator to raise the upper support member to a raised position wherein a upper operating member attached to the upper support member lifts the object from the receiving member.

16. The method of claim 15, wherein the object is a wafer.

17. The method of claim 16, further comprising:
- positioning the wafer over the upper support member and the lower support member with a robot; and
- actuating the first motion actuator to raise the lower support member to a raised position wherein a receiving member attached to the lower support member lifts the wafer from the robot.

18. The method of claim 14, further comprising forming an elastic seal between the upper support member and the chamber at the point where the upper support member and the lower support member penetrate the chamber.

19. A method of moving one or more objects in a chamber, comprising:
- locating a moveable lower support member within the chamber;
- locating a movable upper support member within the chamber and within an axial passageway that extends through the lower support member;
- locating the upper support member so that the upper support member extends from a position above the lower support member to a position below the support member;
- moving the lower support member using a first motion actuator connected to an end portion of the lower support member that extends from the chamber;
- moving the upper support member using a second motion actuator connected to an end portion of the upper support member that extends from the chamber;
- forming an elastic seal between the upper support member and the lower support member; and
- forming an elastic seal between the lower support member and the chamber at the point where the upper support member and the lower support member penetrate the chamber.

20. An apparatus for lifting an object in a chamber, comprising:
- a moveable lower support member disposed within the chamber, the lower support member comprising an upper operating member coupled to an outer shaft and defining an axial passageway extending through the lower support member;
- a first actuator connected to an end portion of the outer shaft;
- a moveable upper support member disposed within the chamber and comprising an inner shaft slidably extending through the axial passageway;
- a second actuator connected to an end portion of the inner shaft; and
- one or more flexible sealing members having at least one end connected to the upper support member and at least another end connected to the chamber.

* * * * *